(12) United States Patent
Sawin

(10) Patent No.: US 6,285,114 B1
(45) Date of Patent: Sep. 4, 2001

(54) ENCAPSULATION TECHNOLOGY FOR SAW DEVICE

(75) Inventor: Raymond L. Sawin, Collinsville, CT (US)

(73) Assignee: Andersen Laboratories, Inc., Bloomfield, CT (US)

( * ) Notice: Subject to any disclaimer, the term of this patent is extended or adjusted under 35 U.S.C. 154(b) by 0 days.

(21) Appl. No.: 09/655,090

(22) Filed: Sep. 5, 2000

Related U.S. Application Data

(62) Division of application No. 09/285,410, filed on Apr. 2, 1999, now Pat. No. 6,182,342.

(51) Int. Cl.[7] .................................................. H01L 41/04
(52) U.S. Cl. ...................................... 310/313 R; 310/340
(58) Field of Search ........................... 310/313 R, 313 A, 310/313 B, 313 C, 313 D, 344, 348, 340

(56) References Cited

U.S. PATENT DOCUMENTS 5,760,526 * 6/1998 Anderson ........................ 310/313 R
6,182,342 * 2/2001 Sawin ........................... 310/313 R X

* cited by examiner

*Primary Examiner*—Mark O. Budd
(74) *Attorney, Agent, or Firm*—Bernhard P. Molldrem, Jr.

(57) ABSTRACT

A bi-layer encapsulation system for a planar acoustic wave device, e.g., a SAW device, employs a layer of controlled particles to contact the active surface of the SAW device, and another layer to lock the first layer in place. A back surface of the device is bonded to a supporting substrate, e.g., a ceramic backing. The particles may be glass microspheres of a nominal 50 micron size. A layer of microspheres cover the acoustically active area of the device. Then, an epoxy or other suitable potting material covers the glass microspheres and bonds to the device and to the supporting substrate. The glass spheres may be solid glass or balloon-like microspheres filled with nitrogen or another gas. A second layer of glass microspheres may be applied over the first layer and around the edges of the first layer. This layer may contain an appropriate B-stage epoxy or a commercially available syntactic foam material. A plurality of devices can be packaged and encapsulated together while in wafer form. A first wafer on which the devices are formed is laminated to a second ceramic wafer. Streets and alleys are removed, and the devices are wire bonded to conductive traces on the ceramic wafer. The devices are encapsulated while the ceramic wafer is still intact.

8 Claims, 1 Drawing Sheet

FIG. 4B      FIG. 4C

ENCAPSULATION TECHNOLOGY FOR SAW DEVICE

This application is a Division of application Ser. No. 09/285,410, filed Apr. 02, 1999, now U.S. Pat. No. 6,182,342.

This invention was developed at least in part under Contract No. F08630-98-C-0059 with the United States Air Force. The government may have certain rights in the invention.

BACKGROUND OF THE INVENTION

The present invention relates to acoustic wave devices, such as SAW devices, which are useful e.g. as filters and oscillators, and is more particularly directed to a technique of packaging these devices which is both economical and rugged.

The invention is more specifically with a packaged device which is highly ruggedized to withstand high-G accelerations without failure. The invention is also concerned with a process for packaging these devices in which a plurality of devices are manufactured and packaged as a single wafer, and are not singulated until after packaging, thus avoiding much of the reasons for high costs in fabrication.

The invention particularly concerns an encapsulation technology for ultrasonic devices for electronic signal processing, whose primary mode of wave propagation is surface-related, as in SAW and STW, there by providing improved performance during mechanical vibration and shock, and also allowing an outer enclosure to be formed in place wet, as in polymer molding.

SAW (Surface Acoustic Wave) devices, STW (Surface Transverse Wave) devices, or similar acoustic wave devices are commonly used in various applications, such as in the spectral filtering of electronic signals. The most common type of these are the SAW devices. In the SAW device, any of various techniques are used to launch a Rayleigh wave, and subsequently receive it after it has traveled along a predetermined path along a prepared region of a substrate material, such as quartz crystal, lithium niobate, or lithium tantalate. Usually, there are metal electrodes connected to some metallized termination, using wire bonds. The surface along which the acoustic wave travels is quite sensitive, and this sensitivity becomes extreme as the frequency of operation increases.

The surface also has to satisfy specific boundary conditions for the ultrasonic wave to propagate correctly, and this includes such practical considerations as cleanliness. A Rayleigh wave has an elliptical particle motion as it travels along the surface and is accompanied by an electric field above the surface that penetrates about one wavelength in the direction normal to the surface. Material on the surface attenuates the wave, and this is especially the case for viscous materials or materials having a significant dielectric constant. The optimum environment for this sensitive surface would be a vacuum, but a head space filled with dry neutral gas, e.g., nitrogen, is often employed. The purpose of the head space is to ensure that essentially nothing touches the active surface. This has restricted prior packaging techniques. Also, as the die and the bonding wires are not embedded in any sort of solid material, large or sustained mechanical vibrations or shock can degrade or destroy the SAW device.

Currently, SAW devices are placed in pre-made packages of ceramic or metal. This means that the devices themselves are singulated prior to that time and have to be inserted into their individual packages. A spot of mounting adhesive on the underside holds the SAW in place. In any practical application, a head space of air or nitrogen is required above the upper surface. This head space is required, as aforesaid, to ensure that essentially nothing touches the active surface so that the acoustic waves can travel on that surface. The need for head space limits the ruggedness of the packaging, and limits the mechanical severity of the environment in which the devices may be used. After the head space is filled with gas, an enclosure lid is attached, and is hermetically sealed to the rest of the package.

These packages are typically pre-fabricated by an outside supplier. Because each of the dies has to be installed individually into its own package, the step of packaging can be quite high. Typically, the cost of the finished SAW device is limited by the cost of the package. Also, the degree to which the size of the device can be reduced is also limited by the requirement for head space.

OBJECTS AND SUMMARY OF THE INVENTION

Accordingly, it is an object of this invention to provide a package and packaging technique that avoid the drawbacks of the prior art.

It is another object to provide a packaged SAW or other acoustic device in which there is substantially continuous contact with the sensitive active surface, but which interferes only minimally with the device's acoustic properties.

It is yet another object to provide a packaging with a dielectric constant near unity, i.e., vacuum, to achieve a minimal acoustic loading, and at the same time to achieve structural rigidity, and also to allow for secondary coverings or coatings for molding or sealing the device.

It is a further object to provide a ruggedized, packaged, acoustic wave device that functions over a wide frequency range, i.e., from below 1 MHz to substantially above 3 GHz.

It is still another object of this invention to achieve this improved packaging at a reduced manufacturing cost.

In accordance with an aspect of the present invention, an acoustic wave device is combined with a package therefor. A planar acoustic wave device, e.g., a SAW device, is formed of a die having an active area on its upper surface that is capable of supporting acoustic waves.

A back surface of the acoustic wave device is bonded to a supporting substrate, which may be a ceramic backing or may be a pre-fabricated package. A bi-layer encapsulation system employs controlled particles that may contact the active surface of the SAW device, and another layer to lock the first layer in place. The particles are selected based on such characteristics as surface energy, Zeta potential, shape, dielectric constant, and conductivity. To that end, in several preferred embodiments, glass microspheres are employed. A layer of glass microspheres may be disposed upon the upper surface of the device to cover the acoustically active area. Then, an epoxy or other suitable potting material covers the glass microspheres and bonds to the acoustic wave device and to the supporting substrate. The glass spheres may be solid glass but preferably these are balloon-like microspheres, of a nominal 50 micron size, and are filled with nitrogen or another gas. The size of the microspheres is related to the frequency of operation of the device. A second layer of glass microspheres may be applied over the first layer of microspheres and around the edges of the first layer. This layer may contain an appropriate B-stage epoxy, or may consist of a commercially available material known as syntactic foam. The bonding wires may be embedded in the material to protect them from vibrations and shock. This technique can be carried out in a preformed enclosure, or a subsequent layer of material may be molded around it to achieve a molded package.

In the interest of economy of manufacture, the SAW product may be handled robotically in wafer form up until the packaging itself is completed. This process of manufacturing packaged acoustic wave devices first involves patterning a first wafer with a plurality of active acoustic wave devices at respective locations on an upper surface of the first wafer. Currently, a manufacturing lithographic mask can be made with 100 patterns, and can potentially yield 100 devices on the wafer using a lithographic process. Dots of a die-mounting adhesive are placed on a second, ceramic wafer, and the first wafer is laminated onto the ceramic wafer. The dots of bonding material contact the lower surface of the first wafer at the respective locations of the acoustic devices. The top wafer only is cut, so that streets and alleys are removed from the top wafer between the acoustic wave devices. This leaves the ceramic wafer intact. At this stage, the devices are in the form of dies adhered to the ceramic wafer with regions of the ceramic wafer exposed between the devices. Conductive areas, i.e., traces, are formed on the exposed areas of the ceramic substrate. These conductive traces may be present prior to the bonding of the top substrate to it. Then devices are wire bonded to the conductive traces. The devices are encapsulated while ceramic wafer is still intact. At this time, the entire wafer can be robotically tested (electrically), stepping die by die around the wafer. Then the dies are robotically marked, and the ceramic wafer is saw cut, or singulated, to yield separate finished SAW filters. No further packaging is required, and the devices can be mounted in circuit. In this technique, none of the SAW devices is handled individually until the very end of fabrication and packaging. This can bring about a cost savings of up to 75 percent, where there are 100 dies per wafer. Also, since there is no separate package into which the SAW filter is placed, this technique yields devices of the smallest possible footprint.

There may be additional devices printed on the ceramic substrate as well, e.g., capacitors or resistors, if needed for a given application, with the advantage of providing a true 50 Ω drop-in device without the need for external matching components.

The above and many other objects, features, and advantages of this invention will become apparent to persons skilled in the art from the ensuing description of a preferred embodiment, which is to be read in conjunction with the accompanying Drawing.

BRIEF DESCRIPTION OF THE DRAWING

FIGS. 4A, 4B, and 4C are a side elevation, top plan, and cross section of a packaged SAW device according to a second embodiment of this invention.

DETAILED DESCRIPTION OF THE PREFERRED EMBODIMENTS

Figure 1:
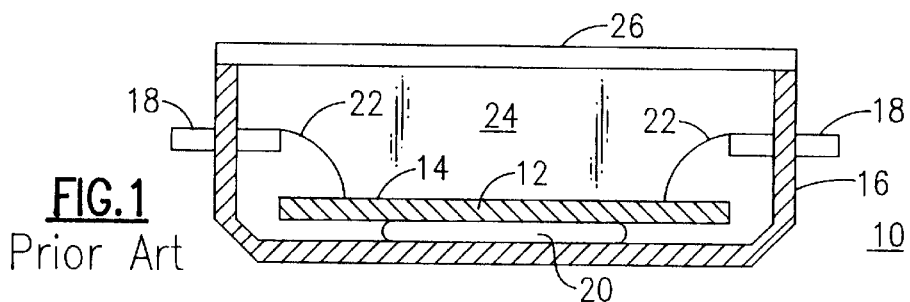
FIG. 1 is a sectional elevation of a packaged SAW device according to the prior art.

With reference to the Drawing, a SAW filter device 10 according to conventional techniques is shown in FIG. 1.

Here, the device 10 comprises a flat chip or die 12, i.e., a portion of a slice or wafer, with an active area 14 on its upper surface. The die 12 is housed in a Kovar shell 16, here in the form of a pan. This shell 16 could alternatively be another material, such as ceramic. Connections are provided through feed-throughs 18. A small quantity of bonding material 20, i.e., adhesive, bonds the lower surface of the die 12 to the floor of the package 16. Wire bonds 22 are also shown here connecting the feed throughs 18 to conductive traces positioned on the active area 14 of the die 12. A head space 24 is provided within the package 16 above the die 12, and this may be filled with nitrogen, helium, or another gas. Finally, a lid 26 is affixed onto an upper rim of the shell 16, e.g., by reflowing a solder layer. In this device there is nothing supporting the die 12 within the package except for the small quantity of adhesive 20. Accordingly, any significant shock or vibration could loosen the die and could also break the bond wires 22. Also, because a significant head space 24 is required, and also the shell 16, there is a limit to the degree to which these devices can be miniaturized.

Figure 2:
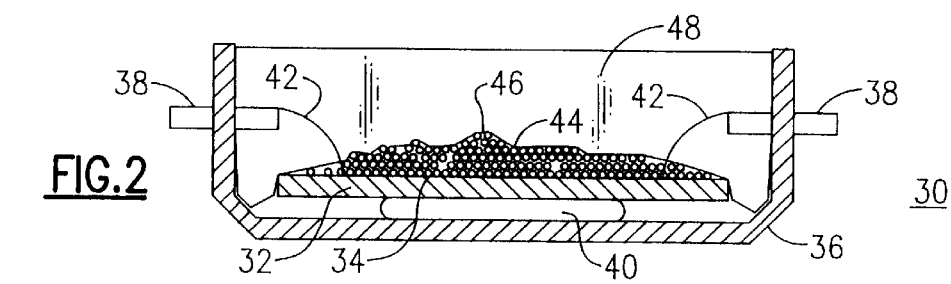
FIG. 2 is a sectional elevation of a packaged SAW device according to one embodiment of the present invention.

FIG. 2 shows a cross section of a packaged SAW device 30 similar to that of FIG. 1 but embodying significant improvements according to this invention. In FIG. 2, the device 30 has a die 32 with an active region 34 on its upper surface, as is conventional, and here is packaged into a package shell 36 similar to that of FIG. 1. The shell 36 has feed-throughs 38, and adhesive 40 holds the die 32 to the floor of the shell 36, with bond wires 42 connecting to the feed throughs 38. However, in this embodiment, the top surface of the die 34 is covered with a layer of glass microspheres 44. A second layer 46, formed of the glass microspheres mixed with an epoxy, covers the first layer 44 and also contacts the sides of the die 34 and the base of the shell 36, and may fill the cavity. The second layer can be cured in an oven at an elevated temperature, e.g., 150° C. There may be some flowage or migration of the epoxy, but is important that the epoxy not contact the active region of the die 32. To this end, the blend of epoxy and glass microspheres must be optimized. A fill of epoxy 48 covers the glass microsphere layers, and also imbeds the wire bonds. The epoxy 48 is preferably a diffusive epoxy foam, and locks the glass microspheres in place. In this case, the lid can be omitted, as the epoxy 48 hermetically seals the die within the shell 36. The epoxy also holds the die and bonding wires securely in place under conditions of extreme stress and vibrations. In this embodiment, the same shape of shell 36 is used as with the prior art embodiment. However, the need for a large head space is eliminated, and so the package 30 can be made much smaller. The head space may be limited only to the zone created by the layers of glass microspheres.

Preferably, the microspheres are balloon-like glass members that may be filled with nitrogen or another inert gas. These may have a nominal diameter of 50 microns, but this can vary with the expected frequency of operation of the device. The spheres are permitted to come into contact with the active surface 14 of the die, but the fraction of the surface that is in contact with the glass is very small. The first glass microsphere layer 44 is free of the epoxy, hardenable polymer or other potting material. The epoxy or other material used in the second layer can be an appropriate B-stage epoxy. One suitable example is a commercially available material known as syntactic foam. The same epoxy material can be employed as the fill 48. A further protective layer can be added if desired.

Another objective of this invention was to provide economies of manufacturing, it being a goal to provide a SAW device that can be robotically processed in wafer form up through the steps of packaging and testing, and to avoid separating the wafer into individual devices until the very end of the process. An example of the process according to an embodiment of this invention can be explained with reference to FIGS. 3A and 3B, with the resulting SAW devices being illustrated in FIGS. 4A, 4B, and 4C.

Figure 3A:
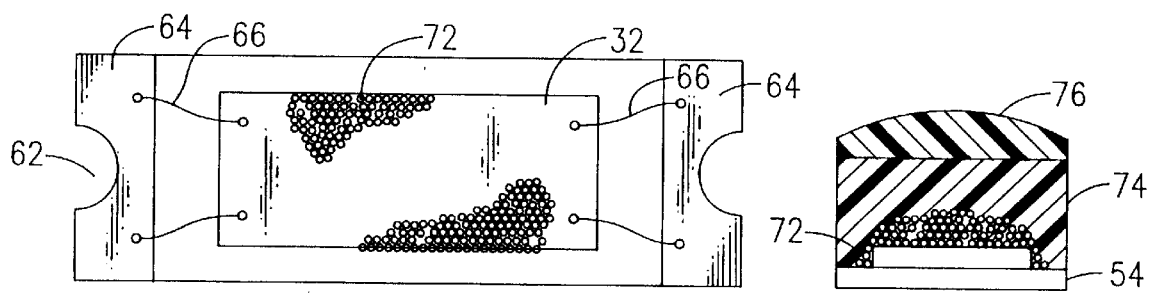
FIG. 3A shows a first wafer and a second wafer laminated together to explain a technique according to another preferred embodiment of this invention.
Figure 3A:
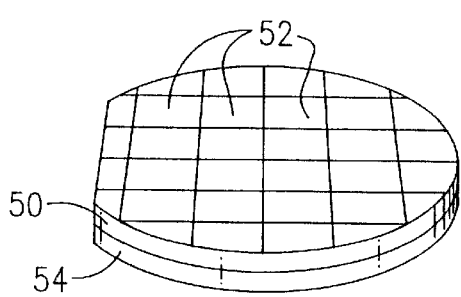
Figure 3B:
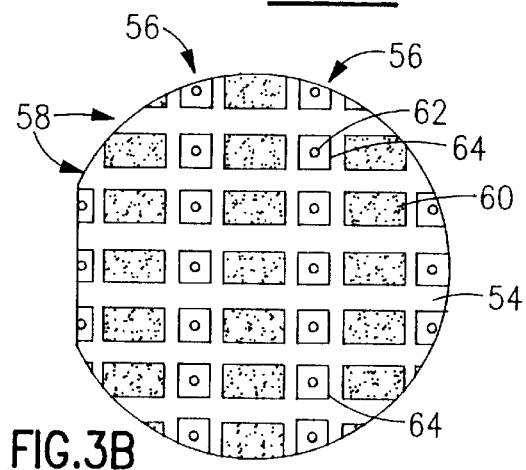
FIG. 3B is a top plan view of the wafer at a later stage of manufacture according to the technique of this embodiment.

In this process, a wafer 50 is patterned to contain a number of distinct SAW elements 52 formed on its upper surface. As many as a hundred or more SAW elements 52 can be formed, but only a few are shown in FIGS. 3A and 3B to simplify the illustration and explanation. Spots of a die mount adhesive are robotically placed on a ceramic wafer 54, and the wafer 50 is laminated to it. Here, the spots of adhesive are placed at the locations corresponding to the positions of the SAW elements 52. The top wafer 50 only is then cut or diced, removing areas around each element 52, that is, removing material from vertical streets 56 and horizontal alleys 58 (horizontal and vertical being considered here from the page orientation in FIG. 3B). This leaves the SAW elements as distinct, separate dies 60. There are laser cut holes 62 and patterned metallized pads or traces 64 formed on the upper surface of the ceramic wafer 54, here in the streets 56 between successive dies 60. These may be formed either before bonding the upper and lower wafers, or after removing material from the upper wafer. Then, the wire bonds are attached, and the dies are encapsulated robotically, by applying layers of glass microspheres and epoxy, as with the first embodiment. After this, the dies can be tested robotically while the ceramic wafer is still intact. This is carried out by stepping a testing probe around the wafer. Then the dies are all robotically marked, again stepping around the wafer. Finally, the devices are saw cut and singulated, producing SAW filter devices ready to mount in circuit.

Figure 4A:
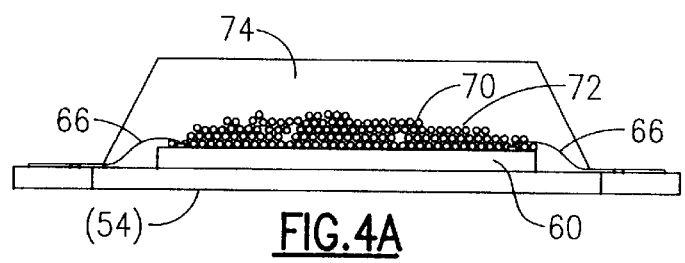

Packaged SAW devices of this technique are shown in FIGS. 4A, 4B, and 4C. Here the die 60 is bonded to a singulated portion of the ceramic wafer 54, and wire bonds 66 connect the die to the metallized pads 64. The metallized pads 64 may be electrically connected through the laser-cut holes 62 to conductive patterns (not shown) on the opposite side of the wafer 54. These patterns would be connected, for example, by the customer or end user to a circuit board. A first layer 70 of glass microspheres covers the active area of the die 60, and a second layer 72 of glass microspheres mixed with epoxy covers the first layer and extends over the edges of the die 60 to contact the ceramic 54. A moldable epoxy 74 encapsulates the layer 72 as well as the first layer 70 and the die 60 and wire bonds 66. An outer layer 76 can be molded or otherwise applied, e.g., as shown in FIG. 4C. The shape of the encapsulated package can be selected as desired. As the die does not have to be separately placed into a pre-fabricated package or shell, this embodiment offers the smallest possible footprint.

While an epoxy is used here for encapsulation, any suitable potting material could be employed, depending on the material characteristics. Also, while the term ceramic has been employed in reference to the base layer or wafer 54, the term should be read broadly, to include not only alumina and the like, but also vitreous materials and glasses, and in some cases including at least some organic or fiber-containing materials. Moreover, while glass microspheres are employed here to contact the active layers of the devices, in other possible embodiments other solid particles could be employed, provided that they have sufficiently low dielectric constant and mechanical density, and contact only a minor fraction of the active surface of the die.

While the invention has been described in detail with respect to one preferred embodiment, it should be recognized that there are many alternative embodiments that would become apparent to persons of skill in the art. Many modifications and variations are possible which would not depart from the scope and spirit of this invention, as defined in the appended claims.

I claim:

1. A combination acoustic wave device and package therefor comprising:

a flat acoustic wave device having an active area on an upper surface thereof capable of supporting acoustic waves;

a supporting substrate to which a back surface of said acoustic wave device is bonded;

a layer of particles disposed upon the upper surface of said device and covering at least said active area; and a fill of potting material covering said particles and bonding to said acoustic wave device and to said supporting substrate, said particles holding said fill of potting material out of contact with said active area.

2. The combination of claim 1 comprising at least one electrode supported on said substrate and a bonding wire connecting said electrode with said active region, said bonding wire being surrounded by said potting material.

3. The combination of claim 1 wherein said particles are in the form of glass microspheres.

4. The combination of claim 3 wherein said glass microspheres include a first quantity of said microspheres in contact with said active area, and a second quantity of glass microspheres mixed with an epoxy and covering said first quantity, said first quantity being substantially free of said epoxy.

5. The combination of claim 1 wherein said potting material includes an epoxy.

6. The combination of claim 1 wherein said potting material includes a syntactic foam.

7. The combination of claim 3 wherein said glass microspheres have a nominal diameter of about 50 microns.

8. The combination of claim 3 wherein at least a portion of said glass microspheres are gas filled.

* * * * *